US009097744B2

(12) United States Patent
Gern et al.

(10) Patent No.: US 9,097,744 B2
(45) Date of Patent: Aug. 4, 2015

(54) METHOD OF DETERMINING PWM VALUES FOR LED MODULES

(75) Inventors: Tobias Gern, Esslingen am Neckar (DE); Uwe Burkhardt, Lichtenstein (DE); Frank Wimbert, Owen (DE); Rainer Kümer, Dettingen (DE)

(73) Assignee: Flextronics International Kft., Tab (HU)

( * ) Notice: Subject to any disclaimer, the term of this patent is extended or adjusted under 35 U.S.C. 154(b) by 478 days.

(21) Appl. No.: 13/557,954

(22) Filed: Jul. 25, 2012

(65) Prior Publication Data

US 2013/0191056 A1    Jul. 25, 2013

(30) Foreign Application Priority Data

Jul. 26, 2011  (DE) .......................... 10 2011 079 796

(51) Int. Cl.
*G06F 19/00*   (2011.01)
*G01R 19/32*   (2006.01)
(Continued)

(52) U.S. Cl.
CPC .............. *G01R 19/32* (2013.01); *G05D 25/02* (2013.01); *H05B 33/0866* (2013.01); *H05B 33/0869* (2013.01)

(58) Field of Classification Search
CPC ................. H01L 2924/00014; H05B 33/0869
USPC ...................... 702/64–66, 182–185
See application file for complete search history.

(56) References Cited

U.S. PATENT DOCUMENTS

| 5,890,794 A | 4/1999 | Abtahi et al. |
| RE36,414 E | 11/1999 | Tickner |

(Continued)

FOREIGN PATENT DOCUMENTS

WO    2011093614    8/2011

OTHER PUBLICATIONS

Office Action dated Dec. 27, 2012, U.S. Appl. No. 12/252,881, filed Oct. 16, 2008, Applicant: Mark R. Callegari, 12 pages.

*Primary Examiner* — Edward Raymond
(74) *Attorney, Agent, or Firm* — Haverstock & Owens LLP

(57) ABSTRACT

A method for obtaining PWM values for an LED module having n LED chips from various color ranges, wherein n>1, wherein for each LED chip a PWM value for producing a target color value is obtained, is characterized in that a calibration measurement is performed in which the wave lengths $(\lambda_{cal1}, \lambda_{cal2}, \lambda_{cal3})$ and/or the standard color proportion values $((x,y)_{cal1}, (x,y)_{cal2}, (x,y)_{cal3})$ and possibly the luminous flux values of the individual LED chips are determined at a calibration temperature $(T_{cal})$, PWM control points are obtained, where each PWM control point contains a PWM value for each of the n color ranges of the LED module, during operation of the LED module a value that depends on the present temperature $(T_a)$ of the LED module, in particular the present temperature $(T_a)$ itself, is determined, and a first and a second PWM control point are assigned to this temperature-dependent value, and the PWM values for producing the target color value are obtained through interpolation between the assigned PWM control points. This makes it possible to realize a precise color mixture in the LED module in a cost-effective way, with little computing power, despite temperature fluctuations (and possible electric current fluctuations).

1 Claim, 5 Drawing Sheets

Figure 1:
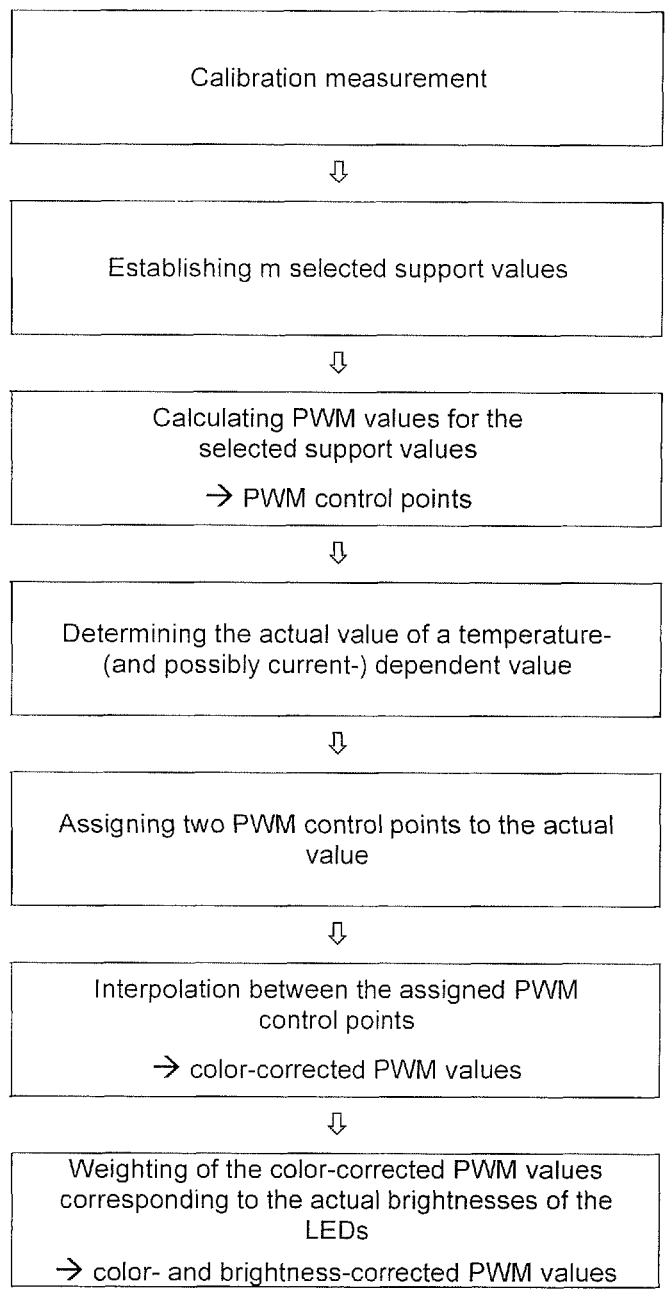

(51) Int. Cl.
 *G05D 25/02* (2006.01)
 *H05B 33/08* (2006.01)

(56) References Cited

U.S. PATENT DOCUMENTS

| | | | |
|---|---|---|---|
| 6,882,111 | B2 | 4/2005 | Kan et al. |
| 7,259,403 | B2 | 8/2007 | Shimizu et al. |
| 8,033,716 | B1 | 10/2011 | Tandy et al. |
| 8,070,325 | B2 | 12/2011 | Zampini et al. |
| 8,227,269 | B2 | 7/2012 | Chen et al. |
| 8,228,261 | B2 | 7/2012 | Callegari |
| 2001/0042865 | A1 | 11/2001 | Oshio et al. |
| 2004/0062031 | A1 | 4/2004 | Pinter |
| 2006/0044806 | A1 | 3/2006 | Abramov et al. |
| 2006/0186430 | A1 | 8/2006 | Park et al. |
| 2007/0035707 | A1* | 2/2007 | Margulis ........................ 353/122 |
| 2008/0048200 | A1 | 2/2008 | Mueller et al. |
| 2009/0179207 | A1 | 7/2009 | Chitnis et al. |
| 2009/0272136 | A1 | 11/2009 | Knoll et al. |
| 2010/0097780 | A1 | 4/2010 | Beatenbough et al. |
| 2010/0295070 | A1 | 11/2010 | Su et al. |
| 2010/0295077 | A1 | 11/2010 | Melman |
| 2011/0018017 | A1 | 1/2011 | Bierhuizen et al. |
| 2011/0062873 | A1* | 3/2011 | Gall et al. ........................ 315/153 |
| 2012/0097985 | A1 | 4/2012 | Liu et al. |
| 2012/0205697 | A1 | 8/2012 | Kim et al. |
| 2013/0050998 | A1 | 2/2013 | Chu et al. |
| 2013/0051001 | A1 | 2/2013 | Miskin |
| 2013/0135866 | A1 | 5/2013 | Souvay et al. |
| 2013/0182425 | A1 | 7/2013 | Seki et al. |
| 2014/0119032 | A1 | 5/2014 | Wimbert et al. |

\* cited by examiner

METHOD OF DETERMINING PWM VALUES FOR LED MODULES

BACKGROUND OF THE INVENTION

The invention relates to a method for obtaining PWM values for an LED module having n LED chips from various color ranges, wherein n>1, wherein a PWM (=pulse width modulation) value is obtained for each LED chip to generate a target color value.

In general, LEDs comprise a plurality of LED chips, and are distinguished by a long service life, great robustness, low energy consumption and a small constructive form, which result in a large number of possibilities for utilization, for example in entertainment electronics, medical technology, telecommunication and in the automotive field. The n LED chips may be applied directly to the circuit board (COB, chip on board), accommodated in a common LED housing (multicolor LED), or accommodated in separate housings (single color LED).

Through additive color mixing on the basis of RGB technology, using LED modules that comprise red, green and blue chips, nearly any mixed color (target color) can be realized. This is done through pulse width modulation, by obtaining a PWM value for a particular target color of each LED chip, which is a measure of the electric current flow through the respective LED chip. A PWM value is the duty cycle (pulse width per cycle duration). In this way the brightnesses of the LED chips, and thus the contribution of the individual LED chips to the mixed color, can be influenced.

An exact color mixture is difficult, however, since the sorting of the LED chips of a color according to a standard includes a large brightness and color range, and both the brightness and the color value are dependent on current and temperature. Different mixed colors therefore result at different temperatures.

While it is possible in principle to perform a corresponding correction of the PWM values, exact calculation of the appropriate PWM values would be extremely computation-intensive and could not be realized using an economical processor.

For economical products, the color changes due to temperature and current are therefore accepted, although this results in products of lower quality.

OBJECT OF THE INVENTION

The object of the invention is therefore to propose a method for obtaining PWM values, which makes it possible in an economical way to realize an exact color mixture in the LED module with little computing power, despite temperature fluctuations (and possibly current fluctuations), so that a prescribed target color is achieved as exactly as possible every time.

BRIEF DESCRIPTION OF THE INVENTION

This object is fulfilled according to the invention by performing a calibration measurement, in which the wave lengths and/or the standard color value proportions and possibly the luminous flux values of the individual LED chips are determined at a calibration temperature, by ascertaining PWM control points, where each PWM control point contains a PWM value for each of the n color ranges of the LED module, by ascertaining a value dependent on the present temperature of the LED module during operation of the LED module, in particular the present temperature itself, and assigning a first and a second PWM control point to this temperature-dependent value, and by obtaining the PWM values to generate the target color value through interpolation between the assigned PWM control points Preferably the model comprises three LED chips (n=3): one LED chip each in the blue, the green and the red color ranges. A color range can be characterized by a certain wave length range. However, it is also possible to perform an RGB mixture using phosphor-converted LED chips, which cannot be captured over ranges of wave lengths.

The calibration measurement is performed at a prescribed temperature (the calibration temperature) and a prescribed current strength (the standard current). If the current strength differs, the calibration values can be converted to standard current. The data of the calibration measurement are saved in a memory of the LED module.

During the operation of an LED module a large number of temperature fluctuations take place, which make a corresponding correction of the PWM values necessary. To this end, the invention provides for determining the PWM values through interpolation between previously established PWM control points. The PWM control points are determined independently of the present temperature (actual temperature) of the LED chips. Each PWM control point contains PWM values for the LED module for a particular selected support value (for example, a prescribed wave length combination or a prescribed temperature, as described in greater detail below). The support values of the PWM control points are compared with the measured present temperature, or with values derived therefrom (for example, wave lengths, forward bias declining at the LED chip), so that two PWM control points can be assigned to the present temperature. This assignment is made by selecting the two PWM control points whose support points come closest to the present temperature, or to values derived from the present temperature (for example, the dominant wave lengths). The interpolation from which the PWM values for generating the target color value are obtained is performed between these assigned PWM control points.

Because of the interpolation between the previously determined PWM control points, it is not necessary to calculate PWM values for every possible temperature and every target color value. Instead, PWM values for the respective present temperature can be determined with little computing effort using the method according to the invention. The PWM values obtained can then be fed in the form of a PWM control signal to a control circuit, which controls the supply of current to the LED chips and thus brings about a regulation of the brightness of the LED chips, so that the desired target color is achieved with high precision.

A special variant of the method according to the invention is distinguished by the fact that the determination of the PWM contact points is made by calculating the PWM values for one prescribed wave length combination at a time, where each prescribed wave length combination contains one wave length for each color range of the LED module, and by the fact that one present wave length combination, which contains present wave lengths of the LED chips at the present temperature, is determined as a temperature-dependent value, and the two PWM contact points whose prescribed wave length combinations come closest to the present wave length combination are assigned.

A present wave length combination of the LED module contains a wave length for each LED chip (preferably the dominant wave length) at the present temperature. "Dominant wave length" means in the CIE diagram the point of intersection of the straight line that runs through the achromatic point and the color locus (Cx, Cy) of the light color of the corresponding LED chip with the spectral color sequence of the color space. Since the light color changes with the temperature, an LED chip has different dominant wave lengths at different temperatures. The determination of the present wave length combination of the LED module is made using data that were obtained from the calibration measurement, as well as from the temperature dependency of the change in wave length of the individual LED chips. The exact initial measurement is thus corrected corresponding to the particular operating conditions. The present wave length can be calculated for example from: $\lambda_a=\lambda_{cal}+(T-T_{cal})*TC_{\lambda dom}$, where $\lambda_{cal}$ describes the wave length of the LED chip at the calibration temperature, preferably 25° C., and $TC_{\lambda dom}$ is a measure of the temperature-dependent change in wave length. The coefficient $TC_{\lambda dom}$ can be obtained from the data sheet belonging to the LED chip (for example: OSRAM 6-lead MULTILED, DOMINANT™ Opto Technologies).

The calibration measurement can be made for this variant independent of the determination of the PWM control points, i.e., either before, during or after determination of the PWM control points.

Each PWM control point is characterized by its corresponding wave length combination (n wave lengths). For the assignment of the two PWM control points to the present wave length combinations, these n present wave lengths must therefore be compared to the n prescribed wave lengths of the PWM control points. The PWM control points whose wave length combinations come closest to the present wave length combination are assigned to the present temperature. The interpolation, preferably a linear interpolation, is then performed between the PWM values of the assigned PWM control points.

Preferably, the prescribed wave length combinations are chosen so that they each contain the dominant wave lengths of the LED chips (dominant wave length combinations) for one prescribed temperature.

The range of the dominant wave length of an LED chip at 25° C., as well as a temperature coefficient $coeff_\lambda$, which describes the temperature dependency of the dominant wave length, are generally listed in the corresponding data sheets (see above).

In order to also take account of the dependency of the LED wave lengths on the electric current, it is beneficial for a present electric current strength to be obtained for each LED chip during operation of the LED module, and for the determination of the present wave lengths to also be made depending on the present current strength of the LED chips. The temperature-dependent and current-dependent calculation of the present wave length can be done for example according to: $\lambda_a(T_a, I_a)=\lambda_{cal}+(T_a-T_{cal})*TC_{\lambda dom}+(I_a-I_{cal})*IC_{\lambda dom}$, where $I_a$ is the measured present electric current strength, $I_{cal}$ is the current strength at which the calibration measurement was performed, and $IC_{\lambda dom}$ is a coefficient that describes the dependency of the wave length on the electric current. $IC_{\lambda dom}(T_a)$ can be dependent on the current or constant.

Preferably, the support points are assigned so that each of the wave lengths of the first assigned PWM control point is at the smallest interval from the present wave length of the same color range, and so that each of the wave lengths of the second assigned PWM control point is at the second-smallest interval from the present wave length of the same color range. In this way, especially precise results are achieved from the interpolation.

Whereas the control points are determined in the previously described variant on the basis of prescribed wave length combinations, an especially preferred variant of the method according to the invention provides that temperatures are prescribed when determining the PWM control points, and module-specific PWM combinations are obtained for these prescribed temperatures, that the present temperature is determined as a temperature-dependent value, and the two PWM control points whose prescribed temperatures come closest to the present temperature are assigned.

"Module-specific" PWM combinations are obtained by using results from the calibration measurement of the corresponding module already when determining the PWM control points. This variant of the method is preferably carried out in the standard color space, but can also be carried out in other color spaces. Results of the calibration measurement can be for example the wave lengths or the standard color value proportions of the LED chips at calibration temperature. Standard color value proportions (x, y, z) are agreed upon internationally in the standard color system as fundamental calibration valences, and serve to represent the color locus in the standard color table. This equation applies: x+y+z=1. Thus it is enough to specify x and y, since z is obtained by calculation. The calculation of module-specific control points from the measured standard color value proportions is especially advantageous, because in this case the exact degree of saturation of the LED chips is taken into account, whereas when non-module-specific control points are used a saturation must be assumed, which results in errors, in particular with green LED chips. In order to ascertain the module-specific PWM combinations, the wave lengths or standard color value proportions of the respective LED chips of the module at the selected temperatures are therefore determined on the basis of the calibration measurement. These wave lengths or standard color value proportions, determined for a selected temperature, form a combination of wave lengths or standard color value proportions for which the PWM values can then be calculated to realize the target color value.

The present temperature-dependent value is assigned to the PWM control points, by comparing the present temperatures to the selected temperatures of the PWM control points. The PWM control points having the selected temperatures that come closest to the present temperature are used for the interpolation.

The module-specific PWM control points can be determined during or after the calibration of the LED module. The PWM control points are stored in a non-volatile memory in the LED module.

Since not only the wave lengths or standard color value proportions, but also their brightness, are dependent on the temperature and the current, it is especially advantageous if the brightness of the LED chips at the calibration temperature is also measured in the calibration measurement, and the present brightnesses of the LED chips are calculated at the present temperature and possibly at the present current strength, and the interpolated PWM values are weighted according to these present brightnesses of the LED chips. In the calibration measurement, the brightness of the light emitted by the LED chips at the calibration temperature and calibration current strength is measured. The present brightness of the LED chips can be determined by means of the initial measurement and the temperature-dependent behavior of the LED chips known from data sheets, for example from $\phi_a(T)=\phi_{cal}(T_{cal})+(T-T_{cal})*coeff_{\phi 1}$ or $\phi_a(T)=\phi_{cal}(T_{cal})*coeff_{\phi 2}(T)$. An analogous brightness correction can also be performed with regard to the current-dependent behavior of the LED chips.

The present temperature of an LED chip can be determined by means of a temperature measurement in the vicinity of the LED chips. Such a measure is relatively imprecise, however, since the temperature of the LED chip cannot ascertained exactly when the temperature sensor is at a distance from the LED chip. Additional heat sources on the circuit board on which the corresponding LED chip is mounted frequently hinder the exact predictability of the temperature difference between measurement point and LED chip. Deviations of several degrees C. can occur. The temperature difference is influenced in part by the thermal transition resistances between temperature sensor and LED chip and by the PWM values. This can be taken into account in a correction. However, in order to increase the precision of the measurement it is advantageous to measure the present temperature of the LED chips directly. The temperature can be measured for each LED chip individually, and then averaged. One of the functions of the temperature is the dropping forward bias at the LED chip. Preferably, the forward bias of at least one of the LED chips of the LED module is therefore measured to determine the present temperature. If the calibration temperature is assigned to the forward bias when calibrating the module, then the temperature of the LED chip can be determined by measuring the forward bias over the known behavior $dV(dT)$ of the LED chips.

The invention also relates to a method for regulating the color mixture within an LED module, in which PWM values are determined using a previously described method and are fed to an actuating unit, where the actuating unit is part of a control circuit for regulating the brightness of the LED chips. The measurement of the present temperature, and possibly of the present current, is performed repeatedly, the procedural step of the assignment and the procedural step of the interpolation to determine new PWM values being repeated if there is a change in the present temperature. The mean current through the LED chips is changed corresponding to the new calculated PWM values. The procedural steps to determine the PWM control values only have to be performed once. The PWM control values are then stored in a memory of the LED module (EEPROM), which is accessed after every temperature measurement.

Preferably, the present temperature-dependent (and possibly current-dependent) value of the LED module is measured continually. This enables the PWM values to be recalculated immediately when there is a temperature change.

When the wave length combination is close to a PWM control point, there is danger of assignment to other PWM control points even in the event of small temperature changes. It can therefore happen, even with small temperature fluctuations or small wave length fluctuations, that many new assignments and corresponding changes of the PWM values occur within a short time, which results in a disturbing flickering. To prevent this, a temperature or wave length hysteresis can be provided, so that only temperature or wave length changes that exceed a certain minimum value result in an assignment of new PWM control points. It is therefore especially preferred that a change of the assigned PWM control points only takes place when the present temperature or the present wave length changes by a minimum amount.

Additional advantages of the invention may be seen from the description and the drawing. Likewise, the features named above and those set forth below can each be utilized alone, or in multiples in any desired combinations. The embodiments shown and described are not to be understood as a conclusive listing, but rather are exemplary in character to describe the invention.

DRAWING AND DETAILED DESCRIPTION OF THE INVENTION

Figure 2:
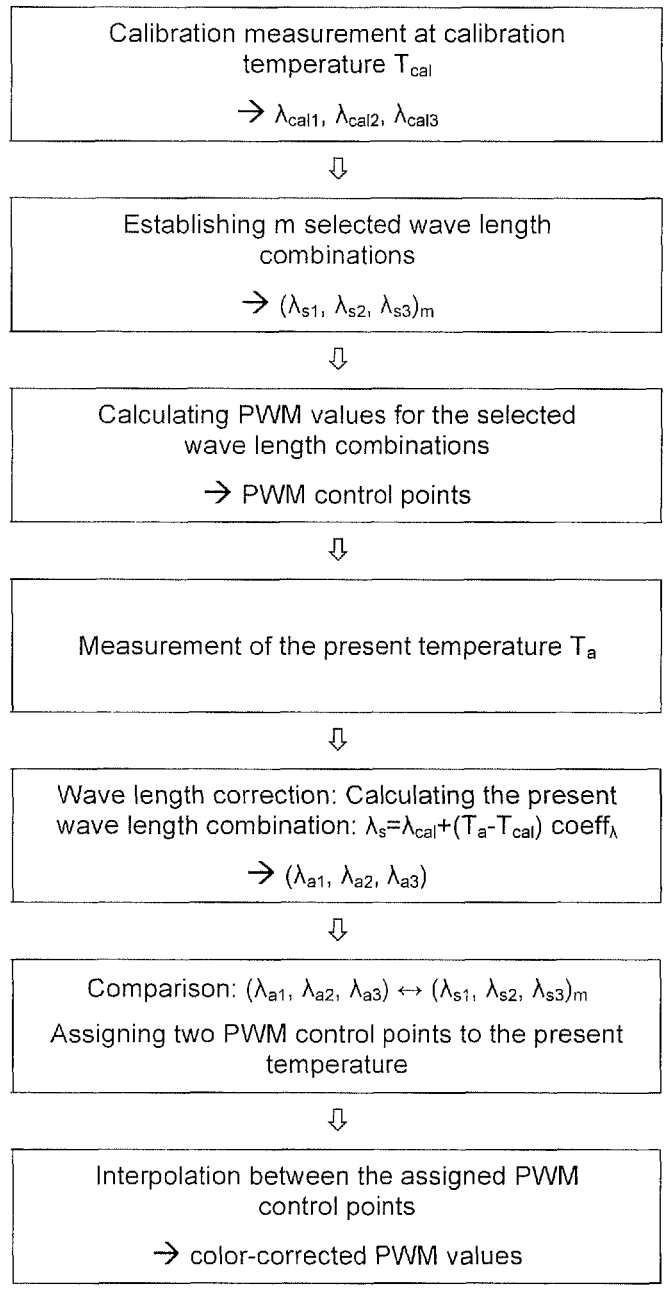
Figure 3:
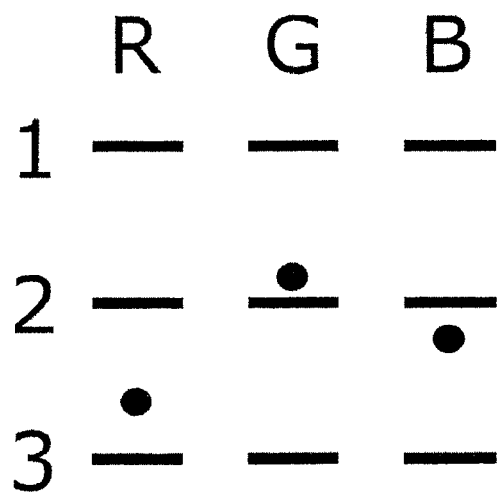
Figure 6:
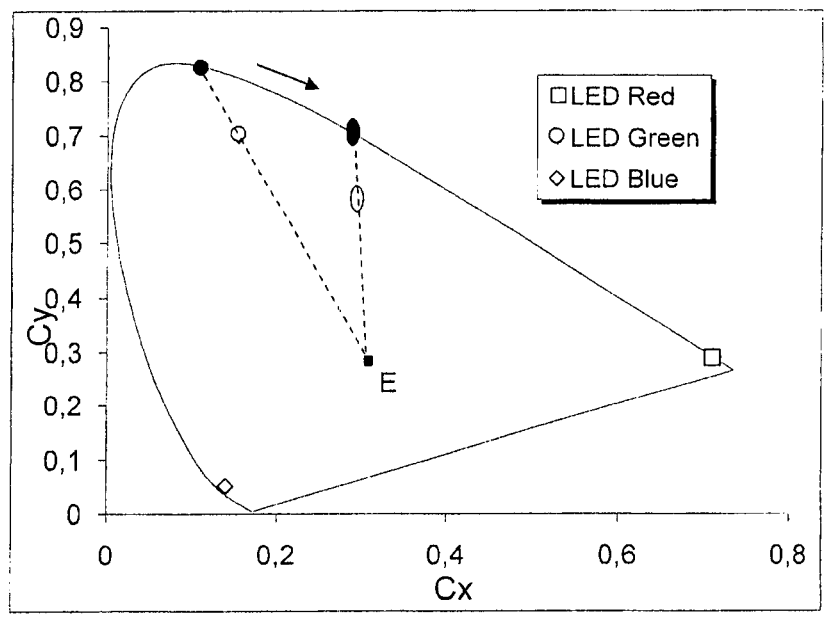
Figure 4:
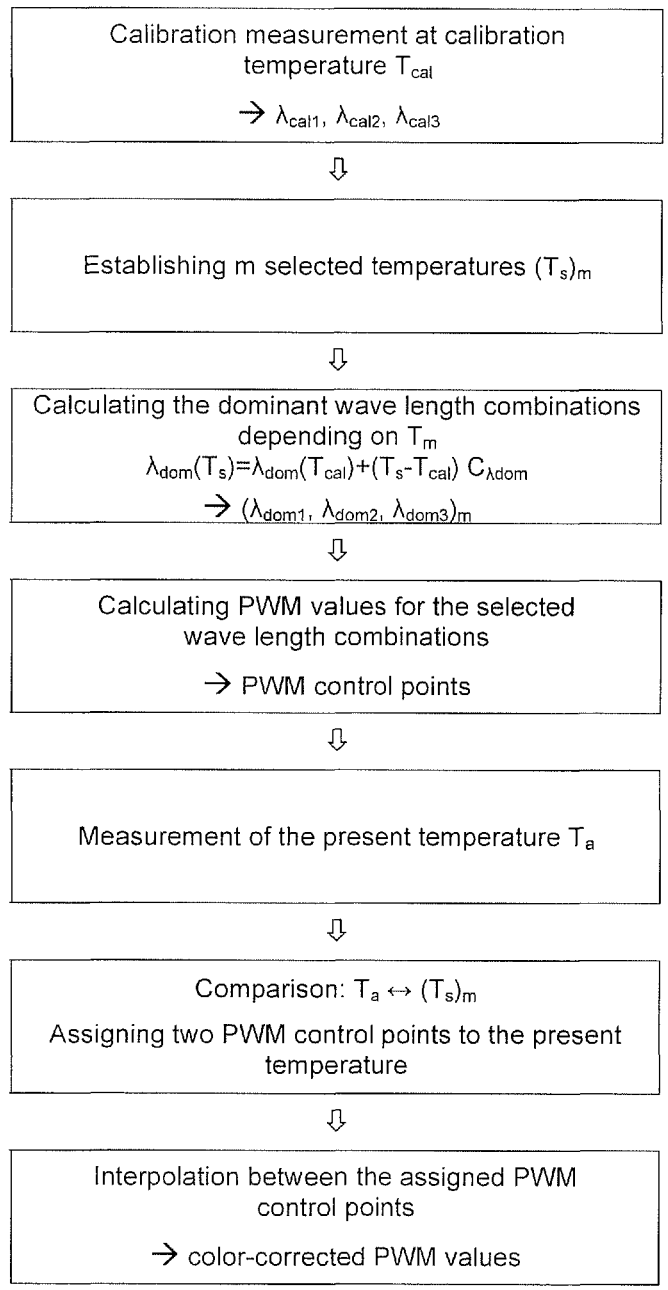
Figure 5:
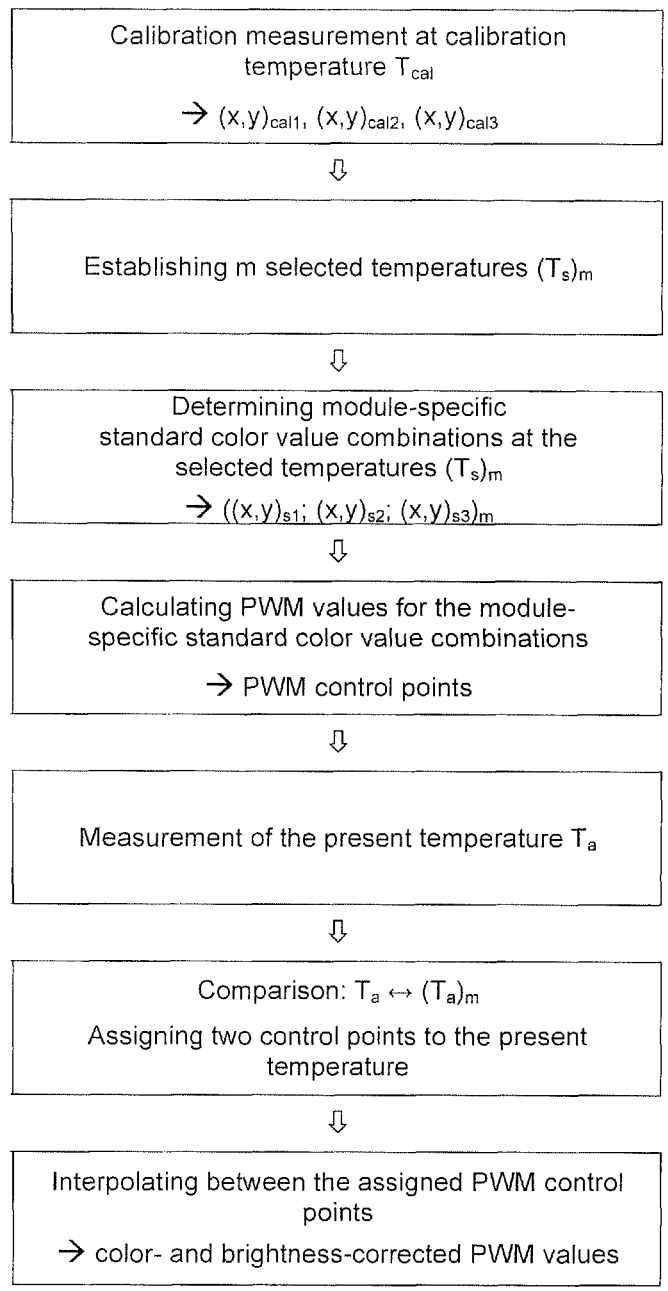

The figures show the following:

FIG. 1 a general flow chart of the method according to the invention;

FIG. 2 a flow chart of a first variant having PWM control points for selected wave length combinations;

FIG. 3 a schematic representation of three prescribed wave lengths for each of three color ranges, to determine the PWM control points, as well as the situation of the present wave lengths;

FIG. 4 a flow chart of a third variant having module-specific PWM control points for wave length combinations;

FIG. 5 a flow chart of a fourth variant having module-specific PWM control points for combinations of standard color value proportions;

FIG. 6 a CIE diagram with the color saturation of the LEDs of an LED module drawn in.

FIG. 1 shows a flow chart of the method according to the invention. In a calibration measurement with prescribed calibration current $I_{cal}$ and prescribed calibration temperature $T_{cal}$, the LED chips are measured exactly, and the data are stored in the EEPROM of the LED module. The temperature and current dependencies of the photometric properties of the LED chips are known.

The determination of the PWM values according to the invention is preferably done separately by color (wave lengths) and brightnesses of the LED chips. Both parameters are dependent on the temperature and current. The temperature and current dependency of the respective mixed colors, which are calculated first for standardized brightnesses of the LED chips, is complex. If the wave length or brightness of only one LED chip changes, the actuation of all three LED chips must be corrected.

According to the invention, PWM control points are calculated. That is, PWM values are calculated for selected values (support values) of a previously determined parameter. The only parameters considered are values that provide conclusions about the temperature (and possibly the current) of the LED chips (for example, the wave length of the light emitted by the LED chips, forward bias, or the temperature or the current itself). Each PWM control point includes for each LED chip a PWM value to attain a target color. Preferably, however, a PWM control point includes PWM values for a plurality of target colors.

TABLE 1

|  | Red (625 nm) | Green (528.5 nm) | Blue (470 nm) |
|---|---|---|---|
| Target color 1 | 1,000 | 0.6 | 0.5 |
| Target color 2 | 0.2 | 1,000 | 0.7 |
| Target color 3 | 0.1 | 0.4 | 1,000 |
| Target color 4 | 0.2 | 1,000 | 0.032 |
| Target color 5 | 1,000 | 0.6 | 0.02 |
| Target color 6 | 1,000 | 0.1 | 0.01 |
| Target color 7 | 1,000 | 0.3 | 0.5 |

Table 1 shows such a PWM control point. The PWM control point contains a PWM value for each target color and each color range.

In the course of the method according to the invention, a temperature-dependent present value (actual value) is measured, preferably the present temperature $T_a$ (=actual temperature). Two of the previously determined PWM support values are assigned to this actual value. When the current dependency is considered, in addition the present current $I_a$ through the LED chips or the actual value of a value that depends on the current is measured. The PWM control points are then assigned to the current/temperature pair ($I_a/T_a$).

The determination of the PWM support values and the assignment of the PWM support values will be explained in greater detail below on the basis of various variants. As an example, the present temperature will be used as a temperature-dependent value.

After the assignment of two PWM control points, the PWM values that are needed at the present temperature to produce the target color are determined by interpolation.

In conclusion, the PWM values determined by interpolation ($PWM_{int}$) can be weighted corresponding to the actual brightness for each LED chip, for example according to $PWM=PWM_{int} \Phi_{norm}/\Phi_{actual}$, where $PWM_{int}$ are the PWM values obtained from the interpolation, $\phi_{norm}$ is the standardized brightness, and $\phi_{actual}$ is the actual brightness.

Depending on the required precision of the color mixture, the number m of PWM control points must be prescribed. When the temperature is used as a temperature-dependent value for determining the PWM control points, as few as two PWM control points are sufficient; preferably, however, three to five PWM control points are used. When wave lengths are used as a temperature-dependent value for determining the PWM control points, wave length combinations each having at least 2 wave length values for each color range must be used. Thus when all of the combinations possible here are used, at least $2^n$ PWM control points result. Preferably, however, $3^n$ to $5^n$ control points are used. The number of wave lengths used for the control points can differ for the different color ranges, depending on the color range in which a more precise calculation is wished.

The PWM values obtained can be fed to a control circuit, which regulates the mean current through the LED chips of the LED module, and hence the brightnesses of the LED chips which are responsible for the color mixture.

In the course of a method for regulating the color mixture within the LED module, it is sufficient to perform the calibration measurement and the determination of the PWM control points once. In order to be able to take account of temperature fluctuations, the present temperature of the LED chips is measured repeatedly, preferably continually. The assignment of PWM control points to the present temperature is also performed repeatedly, at least when a minimum temperature change has occurred.

The method according to the invention can also be carried out without considering the dependency on current and without correction for brightness. The variants described below relate only to color correction based on consideration of temperature dependency. All variants can be combined with a brightness correction, however, in which case the dependency on current can be taken into account when correcting both for the brightness and for the color. This is also advised to optimize the method.

In the variant of the method according to the invention (n=3) shown in FIG. 2, the module works with wave length control points; that is, the wave lengths of the light emitted by the LED chips serve as parameters for the determination of the PWM control points. For each color range, wave lengths are prescribed that are distributed over the entire relevant color range of the respective LED chip, which can be obtained from the data sheet. The temperature drift to be expected is also taken into account here. The wave lengths $\lambda_{s1}, \lambda_{s2}, \lambda_{s3}$ are prescribed independently of the LED chips in the LED module, with the exception that the color range 1, 2, 3 (generally red, green, blue) of the individual LED chips is taken into account. The number of prescribed wave lengths can be different for each color range. For each PWM control point, one wave length $\lambda_{s1}, \lambda_{s2}, \lambda_{s3}$ per LED chip is prescribed in each of the corresponding color ranges 1, 2, 3 (prescribed wave length combinations $(\lambda_{s1}, \lambda_{s2}, \lambda_{s3})_m$). Preferably, all of the wave lengths of one color range are combined with those of the other color ranges. Next, the PWM values are calculated that are necessary in order to attain the target color with the prescribed wave length combinations $(\lambda_{s1}, \lambda_{s2}, \lambda_{s3})_m$.

By measuring the present temperature $T_a$, the present wave length $\lambda_{a1}, \lambda_{a2}, \lambda_{a3}$ of the LED module can be calculated. The present wave lengths $\lambda_{a1}, \lambda_{a2}, \lambda_{a3}$ are the dominant wave lengths of the LED chips, so color saturation is assumed. The n present wave lengths $\lambda_{a1}, \lambda_{a2}, \lambda_{a3}$ form a present wave length combination $(\lambda_{a1}, \lambda_{a2}, \lambda_{a3})$. This present wave length combination $(\lambda_{a1}, \lambda_{a2}, \lambda_{a3})$ is compared to the prescribed wave length combinations $(\lambda_{s1}, \lambda_{s2}, \lambda_{s3})_m$ of the PWM control points. The two PWM control points whose wave length combinations $(\lambda_{s1}, \lambda_{s2}, \lambda_{s3})_m$ come closest to the present wave length combinations are assigned to the present wave length combination $(\lambda_{a1}, \lambda_{a2}, \lambda_{a3})$, and thus also (indirectly) to the present temperature $T_a$.

FIG. 3 shows for each color range R, G, B three prescribed wave lengths R1, R2, R3, G1, G2, G3, B1, B2, B3. The obtained present wave lengths $\lambda_{a1}, \lambda_{a2}, \lambda_{a3}$ are drawn in as points. It is assumed in the present example that every combination of the prescribed wave lengths is present as a control point (i.e., a total of 27 PWM control points). On the basis of data sheet information or special sortings of LED color combinations, PWM control points for wave length combinations that are not needed can be omitted. In order to be able to perform a meaningful interpolation, the present wave length $\lambda_{a1}, \lambda_{a2}, \lambda_{a3}$ of each color range should lie between the wave lengths of the assigned control points of the same color range. The best interpolation result is achieved when that wave length combination whose wave lengths are at the shortest distance from the present wave lengths is assigned as the first PWM control point; in the present case this is the combination R3-G2-B2. That wave length combination whose wave lengths are at the second shortest distance from the present wave lengths is assigned as the second assigned PWM control point; in the present case this is the combination R2-G1-B3. In the event that not all combinations of the prescribed wave lengths are present as PWM control points, it can occur that the minimum distance of the present wave length of a color range is present at a different PWM control point, as the minimum distance of the present wave length of a different color range. In this case, the decision about which PWM control point should be assigned can be made by way of the minimum sum of the distances of all wave lengths of a control point to the present wave lengths. If a wave length does not lie between two prescribed wave lengths, so that it is outside of the interpolation range, the nearest prescribed wave length is used to form both wave length combinations.

Depending on the distances of the present wave lengths $\lambda_{a1}, \lambda_{a2}, \lambda_{a3}$ from the wave lengths $\lambda_{s1}, \lambda_{s2}, \lambda_{s3}$ of the assigned PWM control points, an interpolation value is calculated for each LED chip.

If the calibration measurement is performed before the determination of the PWM control values, it is also possible to include the results of the calibration measurement in the determination of the PWM control points. In this way, module-specific PWM control values can be obtained. This is especially advantageous, since the precise calculations demand high-power computing in conjunction with the assignment step of the previously described variant of the LED module. This is correspondingly expensive. In order to be able to mix exact color values using little computing power, in the following variants a large part of the calculations are taken over by the calibrating device when calibrating the module.

FIG. 4 shows such a variant, in which the dominant wave lengths $\lambda_{cal1}$, $\lambda_{cal2}$, $\lambda_{cal3}$ obtained at calibration temperature $T_{cal}$ are used already for the calculation of the wave length combinations for the PWM control points. To that end, first m temperatures $(T_s)_m$ are selected, and for these temperatures $(T_s)_m$ (starting from the dominant wave lengths $\lambda_{dom1}(T_{cal})$, $\lambda_{dom2}(T_{cal})$, $\lambda_{dom3}(T_{cal})$ obtained at the calibration temperature $T_{cal}$), the corresponding wave length combinations $(\lambda_{dom1}, \lambda_{dom2}, \lambda_{dom3})_m$ are calculated, according to $\lambda_{dom1}(T_s) = \lambda_{dom}(T_{cal}) + (T_s - T_{cal}) C_{\lambda dom}$. The wave length combinations $(\lambda_{dom1}, \lambda_{dom2}, \lambda_{dom3})_m$ calculated in this way correspond to the real wave length combinations at the corresponding temperatures $(T_s)_m$. These are therefore module-specific PWM control points. The PWM control points can therefore be (but do not have to be) assigned directly (i.e., without calculating the present wave lengths) to the present temperature $T_a$. Only the selected temperatures $(T_s)_m$ may be compared to the present temperature $T_a$. The two PWM control points whose temperatures come closest to the present temperature $T_a$ are assigned to the present temperature $T_a$, and are used for the interpolation to determine the PWM values for the present temperature $T_a$.

When module-specific control points for the present temperature $T_a$ are used, in contrast to the use of non-specific PWM control points, it is possible to work with module-specific color value proportions x, y, even with little processor power. This makes it possible to take account of the exact color saturation in the calculation. The use of color value proportions instead of dominant wave lengths is advantageous, inasmuch as when dominant wave lengths are used a color saturation must be assumed that can deviate from reality. The differences in the color saturations can be great, in particular for chips in the green spectral range. FIG. 6 shows that the actual color locus (unfilled circle in FIG. 6) of the emitted light is clearly at some distance from the spectral color sequence. This distance represents the saturation. The saturation can have a great scattering between two LED chips of the same sort. The filled-in circle in FIG. 6 identifies the position of the dominant wave length on the spectral color sequence.

A corresponding variant is shown in FIG. 5. Here, standard color value proportions $(x,y)_{cal1}$, $(x,y)_{cal2}$, $(x,y)_{cal3}$ are measured at the calibration temperature $T_{cal}$. Module-specific standard color value proportions $((x,y)_{s1}, (x,y)_{s2}, (x,y)_{s3})_m$ are calculated accordingly for the selected temperatures $(T_s)_m$. Otherwise, the method proceeds analogously to the variant shown in FIG. 4. The module-specific standard color value proportions $((x,y)_{s1}, (x,y)_{s2}, (x,y)_{s3})_m$ are calculated by determining the dominant wave length at calibration temperature (filled-in dot in FIG. 6): with the aid of the known temperature dependency of the dominant wave length, the dominant wave length (filled-in oval in FIG. 6) at the selected temperatures can be calculated, and from the latter (assuming a saturation, e.g., unchanged saturation) in the color diagram the corresponding color value proportions (non-filled oval in FIG. 6) can be determined.

With the variants having module-specific PWM control points, shown in FIGS. 4 and 5, it is necessary, in contrast to the variant shown in FIG. 2, that the calibration measurement be performed prior to determination of the PWM control points.

In the method according to the invention presented in the application, PWM combinations (PWM control points) for producing a desired target color are calculated for selected conditions of the LED module (certain wave length combinations within the LED module, temperature of the LED module, forward bias present at the LED chips, current flow through the LED chips). The ACTUAL state (present wave length combination, present forward bias, present temperature, present current) of the LED module is determined by measuring a present temperature-dependent and possibly current-dependent value, and is compared to the selected states of the PWM control points. Between the PWM control points whose states come closest to the ACTUAL state, an interpolation is performed by means of which PWM values for the ACTUAL state of the LED module are calculated. In this way it is possible on the one hand to operate an LED module in such a way that light of a desired target color is always emitted with high precision, despite fluctuations in temperature and current, and on the other hand the computing cost can be kept small by choosing a manageable quantity of PWM control points to be calculated.

The method according to the invention can be employed in particular for the development of ambient lighting for vehicles and aircraft.

The invention claimed is:

1. A method of determining PWM-values for a LED module with n LED chips of different color ranges, where n>1, and for each LED chip, identifying a PWM-value for generating a target color value, the method comprising:
   a. performing a calibration measurement such that wavelengths $(\lambda_{cal1}, \lambda_{cal2}, \lambda_{cal3})$ and/or chromaticity coordinates $((x,y)_{cal1}, (x,y)_{cal2}, (x,y)_{cal3})$ of an individual LED chip at a calibration temperature $(T_{cal})$ are determined;
   b. determining PWM support points, wherein each PWM support point depends on a PWM value for each of the n color ranges of the LED module;
   c. during operation of the LED module at a current temperature $(T_a)$ of the LED module, determining the current temperature $(T_a)$ and assigning the current temperature a first and a second PWM support points; and
   d. obtaining PWM values for generating the target color value assigned by interpolation between the PWM support points.

* * * * *